United States Patent [19]

Bird

[11] Patent Number: 5,003,249

[45] Date of Patent: Mar. 26, 1991

[54] ELECTRICAL POWER DETECTION AND INDICATION DEVICE

[76] Inventor: Bruce R. Bird, Box 2033, Tisdale, Sask., Canada, S0E 1T0

[21] Appl. No.: 509,087

[22] Filed: Apr. 16, 1990

[51] Int. Cl.[5] .................... G01R 31/02; H01R 4/24
[52] U.S. Cl. ............................. 324/122; 324/133; 324/538; 324/725; 324/556; 439/490
[58] Field of Search ............... 324/122, 72.5, 538, 324/555, 556, 133; 340/660, 657; 439/488, 489, 490, 491, 389, 387, 427

[56] References Cited

U.S. PATENT DOCUMENTS

| | | | |
|---|---|---|---|
| 3,538,436 | 11/1970 | Weeks et al. | 324/133 |
| 3,768,005 | 10/1973 | Louks | 324/555 |
| 4,614,394 | 9/1986 | Chelin | 439/391 |
| 4,738,633 | 4/1988 | Fremgen et al. | 439/490 |
| 4,813,883 | 3/1989 | Staley | 439/391 |
| 4,829,255 | 5/1989 | Van Der Stuyf | 324/538 |

Primary Examiner—Reinhard J. Eisenzopf
Assistant Examiner—Vinh P. Nguyen

[57] ABSTRACT

An electrical power detection and indication device for quick and simple external attachment onto an insulated electric power cord, is linked to the conductors of the power cord by sharp probes which penetrate the insulation on the power cord conductors. The device can be configured to give a variety of audible or visible signals that indicate the presence or absence of electrical power and can also be used to detect and indicate polarity or grounding integrity. Modular construction allows flexibility with regard to power cord size, cord conductor number, and cord conductor arrangement, as well as with the type of indication desired.

8 Claims, 5 Drawing Sheets

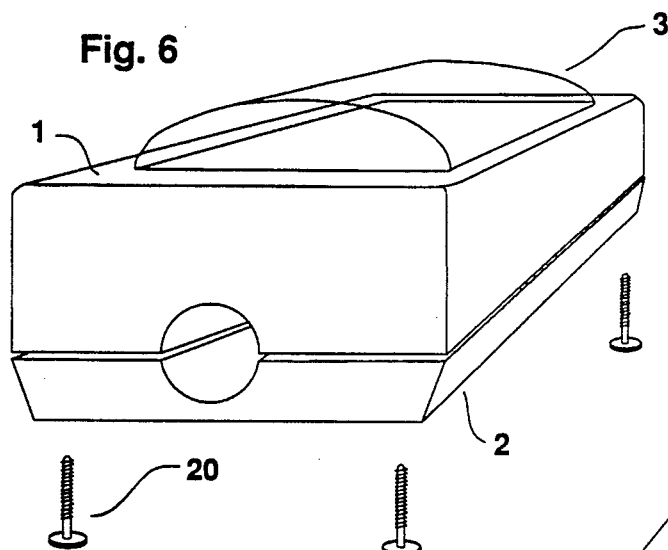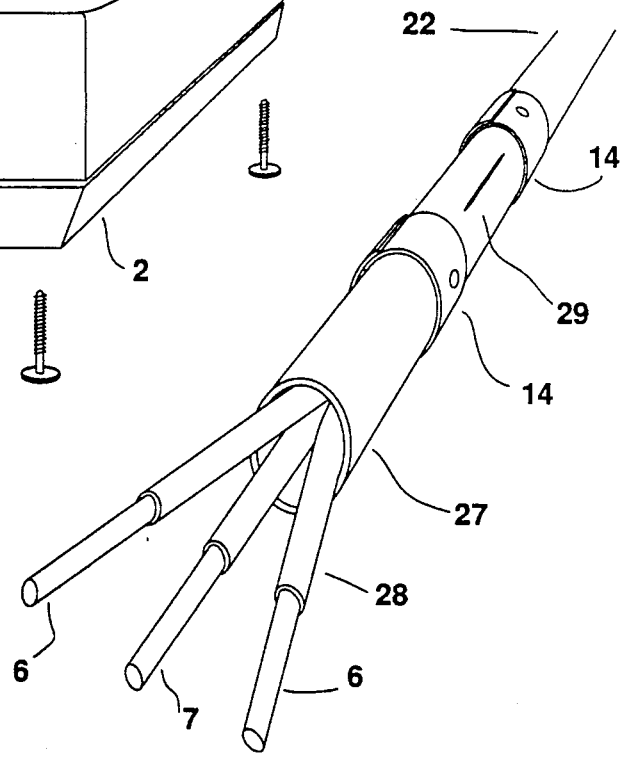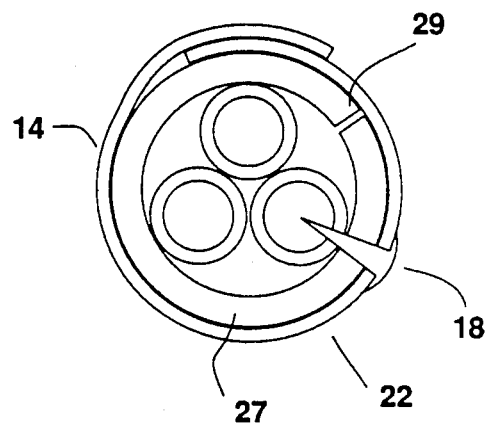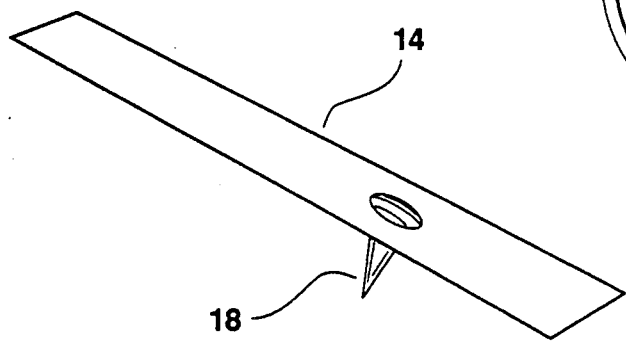

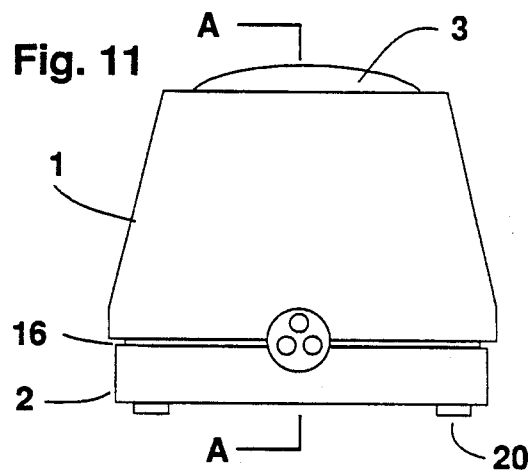
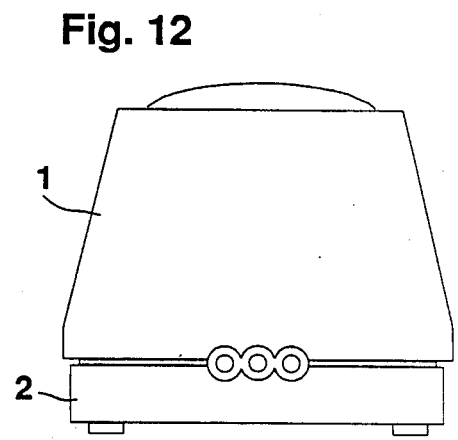
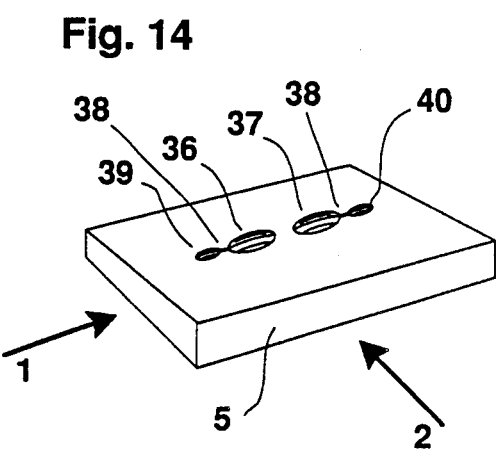
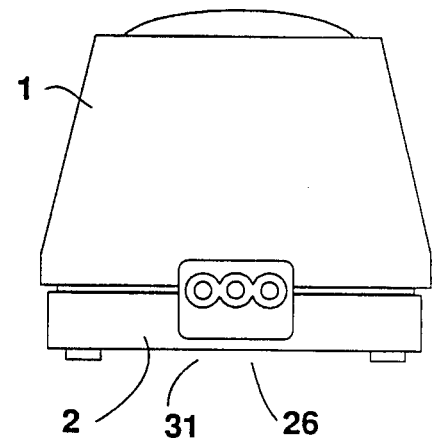
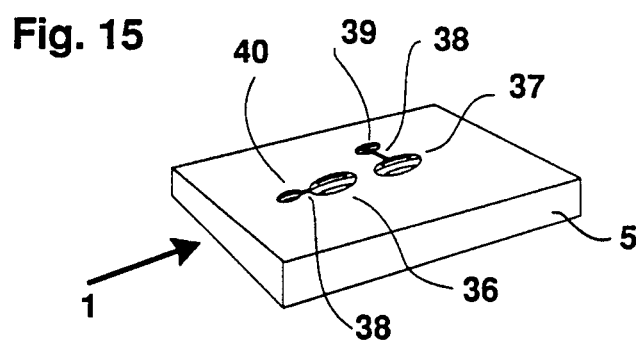

5,003,249

ELECTRICAL POWER DETECTION AND INDICATION DEVICE

BACKGROUND OF THE INVENTION

The present invention relates to devices that indicate the presence of electrical power in electrical power conductors or cords. Most detection and indication devices are housed within a male or female plug that is attached to the end of electrical cords. The present invention provides the advantage of allowing very quick installation of a power detection and indication device anywhere on most types of non metallic covered, flexible electrical power cords or conductors. One embodiment of the invention further allows a variety of specialized uses with only minor changes in the basic design of some of the embodiment's components.

SUMMARY OF THE INVENTION

Among the objects of the present invention are to provide an electrical power detection and indication device that can be quickly attached to a variety of electrical power cords without cutting the cord or removing an end fitting. A further object of the invention is to allow a broad flexibility of function by allowing the rapid and economical tailoring of the quick connecting device to a variety of purposes. The indication of cord voltage may take the form of a humanly detectable audible or visual signal or it may be in the form of an activated relay, a radio signal, or some other form of humanly inaudible or invisible signal.

The present invention therefore provides an electrical power detection and indication device for external attachment onto an insulated electrical power cord having two or more insulation coated conductors, comprising a body, an electrical voltage detection and indication means having a first electrical connection terminal and a second electrical connection terminal, the electrical voltage detection and indication means being housed within the body, a first and a second pointed electrically conductive probe spaced from each other and protruding from the body and rigidly attached to the body, insulation means to electrically isolate the first conductive probe from the second conductive probe, electrically conductive means attaching the conductive probes to the first and the second connection terminals such that a circuit is formed leading the first conductive probe through the electrical voltage detection and indication means and on to the second conductive probe, a clamping means, a first moisture sealing means, whereby the body can be secured against the insulated electrical power cord by the clamping means such that the first and second pointed electrically conductive probes each penetrate the insulation of and come in contact with the internal core of separate conductors of the insulated electrical power cofd, the electrical voltage detection and indication means detects and then indicates with a visual or audible signal if there is an electrical voltage differential between the separate conductors, and the first moisture sealing means prevents any moisture from penetrating the holes in the conductor insulation caused by the penetration of the electrically conductive probes.

The present invention also provides an electrical power detection and indication device for external attachment onto an insulated electrical power cord having two or more insulation coated conductors, comprising a body, an electrical voltage detection and indication means having a first electrical connection terminal and a second electrical connection terminal, the electrical voltage detection and indication means being housed within the body, a first and a second electrically conductive contact spaced from each other and protruding from the body and rigidly attached to the body, insulation means to electrically isolate the first electrically conductive contact from the second conductive contact, electrically conductive means attaching the conductive contacts to the first and the second connection terminals such that a circuit is formed leading from the first conductive contact through the electrical voltage detection and indication means and on to the second conductive contact, two flexible electrically conductive strips each strip having a single pointed electrically conductive probe protruding at right angles from the surface of the flat strip, the probe being bonded to the strip so as to form one electrically conductive unit, a clamping means, a first moisture sealing means, whereby the conductive probes can each be selectively penetrated through the insulation coating on two separate insulation coated conductors of the electrical power cord so as to make electrical contact with the conductor, the penetration points are spaced from each other lengthwise relative to the electrical power cord, the flexible conductive strips can be wrapped tightly around the circumference of the cross section of the electrical power cord, the body can be secured against the insulated electric power cord by the clamping means such that the first and second electrically conductive contacts each come in contact with one of the flexible conductive strips, the electrical voltage detection and indication means detects and then indicates with a visual or audible signal if there is an electrical voltage differential between the separate conductors, and the first moisture sealing means prevents any moisture from contacting the flexible conductive strips or penetrating the holes in the conductor insulation caused by the penetration of the electrically conductive probes.

The present invention also provides an electrical power detection and indication device for external attachment onto an insulated electrical power cord having two or more insulation coated conductors, further comprising a cavity within the body, the cavity having a first opening and a second opening opposite the first opening, a restrictive lip around the periphery of the second opening, a second moisture sealing means associated with the restrictive lip, the electrical voltage detection and indication means being formed as a first module that will fit through the first opening and will fit snugly in the cavity in the body and seal in a stable manner against the restrictive lip and against the second moisture sealing means, the pointed electrically conductive probes being rigidly attached to a second module that will fit snugly into the cavity in the body after the first module has been slipped into the cavity, the probes protruding outwards from the outer face of the second module, electrically conductive transfer and contact means linking the conductive probes to the first and second connection terminals such that when the first and the second module are pressed together within the cavity, a circuit is formed leading from the first conductive probe through the electrical voltage detection and indication means and on to the second conductive probe, whereby the first module and the second module are securely held against each other and are also securely held within the cavity by the pressure of the electrical power cord being pressed between the body and the clamping means, and the first moisture sealing means prevents moisture from penetrating the first opening of the cavity.

The present invention also provides an electrical power detection and indicator device for external attachment onto an insulated electric power cord having two or more insulation coated conductors, further comprising a cavity within the body, the cavity having a first opening and a second opening opposite the first opening, a restrictive lip around the periphery of the second opening, a second moisture sealing means associated with the restrictive lip, the electrical voltage detection and indication means being formed as a first module that will fit through the first opening and will fit snugly in the cavity in the body and seal in a stable manner against the restrictive lip and against the second moisture sealing means, the electrically conductive contacts being rigidly attached to a second module that will fit snugly into the cavity in the body after the first module has been slipped into the cavity, the contacts protruding outwards from the outer face of the second module, electrically conductive transfer and contact means linking the conductive contacts to the first and second connection terminals such that when the first and the second module are pressed together within the cavity, a circuit is formed leading from the first conductive contact through the electrical voltage detection and indication means and on to the second conductive contact, whereby the first module and the second module are securely held against each other and are also securely held within the cavity by the pressure of the electrical power cord being pressed between the body and the clamping means, and the first moisture sealing means prevents moisture from penetrating the first opening of the cavity.

By one feature, the present invention also provides an electrical power detection and indication device for external attachment onto an insulated electrical power cord having two or more insulation coated conductors, as claimed in claim 2 or claim 4, wherein the moisture sealing means consists of a pliable, waterproof, tubular sleeve that conforms to the body and to the clamping means and the sleeve has an internal passage that conforms to the outer dimensions of the electrical power cord, has sections removed to accommodate the electrically conductive strips and also the conductive contacts, and further the sleeve is slit along one side to allow insertion of the electrical power cord, whereby several sizes of electrical power cords can be fitted to a single size of the body and the clamping means by altering the size and shape of the moisture sealing means.

By another feature, the present invention also provides an electrical power detection and indicator device for external attachment onto an insulated electrical power cord having two or more insulation coated conductors, as claimed in claim 1 or in claim 3, wherein a channel moulded in the body orients the electrical power cord so the pointed electrically conductive probes align correctly with specific conductors of the electrical power cord.

By yet another feature, the present invention also provides an electrical power detection and indicator device for external attachment onto an insulated electrical power cord having two or more insulation coated conductors, as claimed in claim 6, the clamping means consisting of a first clamping segment and a second clamping segment, the body comprising one clamping segment, at least one of the clamping segments being composed of a flexible, resilient plastic material, one the clamping segment being shaped to fit into a position immediately adjacent the second clamping segment, access to that adjacent position being attainable only through the exertion of a force directed to move the two segments into that position, attainment of the immediately adjacent position resulting in the cessation of the need for force to maintain the achieved relative position of the two clamping segments, whereby, the placement of the electrical power cord between the two clamping segments and the forcing of the two clamping segments into their the immediately adjacent position results in the secure clamping of the electrical power cord relative to the two clamping segments.

By another feature, the present invention also provides an electrical power detection and indicator device for external attachment onto an insulated electrical power cord having two or more insulation coated conductors, as claimed in claim 7, the first moisture sealing means consisting of the accurate fit of the moulded channel relative to the insulated electrical power cord in combination with the pressure exerted on the electrical power cord by the clamping means.

BRIEF DESCRIPTION OF THE DRAWINGS

In the accompanying drawings,

FIG. 6 is a perspective view of a second embodiment of the present invention.

FIG. 7 is a perspective view of a round three conductor electrical cord with two flexible electrically conductive strips shown in FIG. 9 installed on it.

FIG. 8 is a two dimensional cross sectional end view of the electrical cord and one conductive strip shown in FIG. 7.

FIG. 9 is a perspective view of a flexible electrically conductive strip with a connected, pointed, electrically conductive probe.

FIG. 11 is a two dimensional end view of an embodiment of the invention that is similar to the embodiment in FIG. 6 and 10, in this case attached to a three conductor round electrical cord.

FIG. 12 is a two dimensional end view of an embodiment of the invention that is similar to the embodiment in FIG. 6 and 10, in this case attached to a three conductor flat electrical cord.

FIG. 13 is a two dimensional end view of an embodiment of the invention that is similar to the embodiment in FIG. 6 and 10, in this case attached to a three conductor flat electrical cord housed within in a pliable waterproof tubular sleeve.

FIG. 14 is a perspective view of a module made up of a flat slab with contacts and connectors on it. The same module also is shown in FIG. 19 and FIG. 20 as seen from View 2. It is shown in FIG. 18 as seen from View 1.

FIG. 15 is a perspective view of a second module made up of a flat slab with contacts and connectors on it. A variation of this module is shown in FIG. 17 as seen from View 1.

DETAILED DESCRIPTION OF THE DRAWINGS

Description of FIGS. 1 to 5

Figure 1:
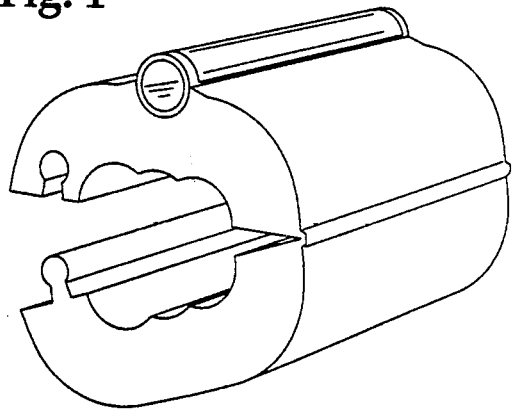
FIG. 1 is a perspective view of one embodiment of the present invention.
Figure 5:
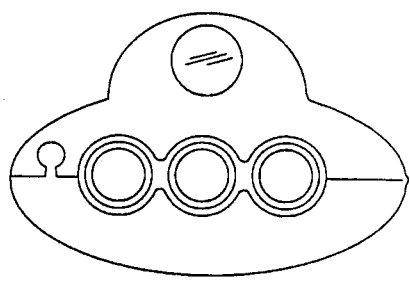
FIG. 5 is a two dimensional end view of the basic embodiment of FIG. 1 snapped in place on the electrical cord of FIG. 4.
Figure 2:
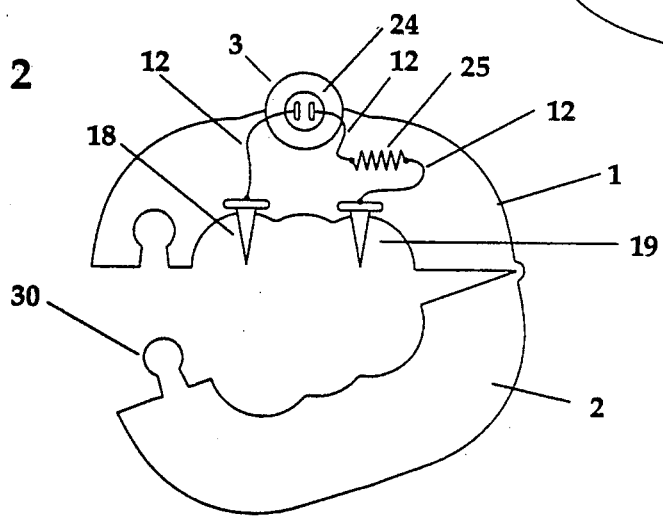
FIG. 2 is a two dimensional sectional view of the embodiment shown in FIG. 1 showing a sectional view of the internal details.
Figure 4:
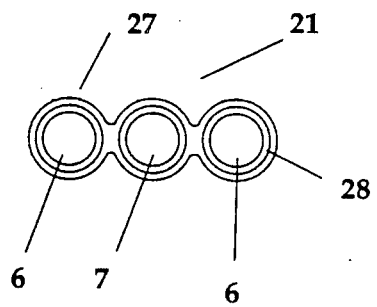
FIG. 4 is a cross sectional end view of a three conductor electrical cord.
Figure 3:
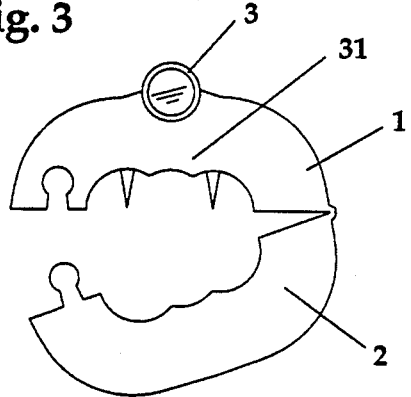
FIG. 3 is a two dimensional end view of the embodiment shown in FIG. 1.

FIG. 1 pictures a plastic device designed to be snapped onto a flat, three conductor electrical cord, an example of which is shown in FIG. 4 as a two dimensional cross sectional view. This embodiment of the invention is equipped with an electrical voltage detection and indication means (3) which in this example is a neon lamp (24) which is connected from its connection terminals to two pointed electrically conductive probes (18) (19) by electrically conductive means (12) which in this example consist of wires and a resistor that reduces current flow through the neon lamp. The device consists of the body portion (1) which houses the voltage detection and indication means (3) and the clamping means (2) which is a secondary segment that serves to secure the electrical cord snugly against the main body (1). FIG. 5 is an end view of a device, the same as the device in FIGS. 1, 2, and 3, apart from exact shape, that has been snapped shut on the same type of three conductor electrical cord (21) as shown in the end view cross section in FIG. 4. The electrical cord is aligned to the device by the shape of the contoured wire groove (31), the device is snapped closed, and the pointed electrically conductive probes (18) (19) pierce through the outer insulation sheath (27), the individual conductor insulation (28), and the conductor itself (6). A similar example of a round electrical cord is illustrated in FIG. 8. The embodiments illustrated in FIGS. 2 and 3 are arranged to show a voltage differential between conductors (6) and (6), normally the "neutral" and "hot" conductors. If the electrical power cord is powered, the neon light will light up. If the probes (18) (19) are positioned to puncture the ground conductor (7) as well as which ever conductor is "hot", the device will indicate whether the ground system is functional and whether polarity is correct by the neon light lighting up. If the probes (18) (19) are positioned to puncture the ground and the neutral conductor, the lighting of the bulb will indicate that polarity is reversed. The embodiment depicted has the probes (18) (19), the electrical voltage detection and indication device (3), and the electrically conductive connections (12), moulded right into the body (2) of the device. FIG. 1 depicts clear plastic end and side viewing ports for the light of the neon lamp to shine out. The embodiment permits the neon bulb to be replaced with any number of electrical voltage detection and indication devices such as audible buzzers or tone generators, voltage meters, incandescent bulbs, a radio signal transmitter, a liquid crystal display, or a relay. An incorrect polarity in the electrical cord could produce an audible signal. A battery can be added to the embodiment to power a visual or audible indication means that would be activated by a relay should there be an absence of electrical voltage in the electrical power cord. For example, such an embodiment could be arranged to provide an audible sound when there was a failure of electrical cord power. A method for keeping a standby battery charged during the times when the electrical cord is carrying power can also be added to the embodiment. Sealing against moisture penetrating to the probes (18) (19) and into the holes the probes pierce in the insulation of the electrical cord is provided by the tight fit of the contoured wire groove (31) against the slightly resilient insulation of the electrical cord. A thin layer of resilient material may be added to the surface of the contoured wire groove to increase the moisture sealing capacity.

Description of FIGS. 6 to 10

Figure 10:
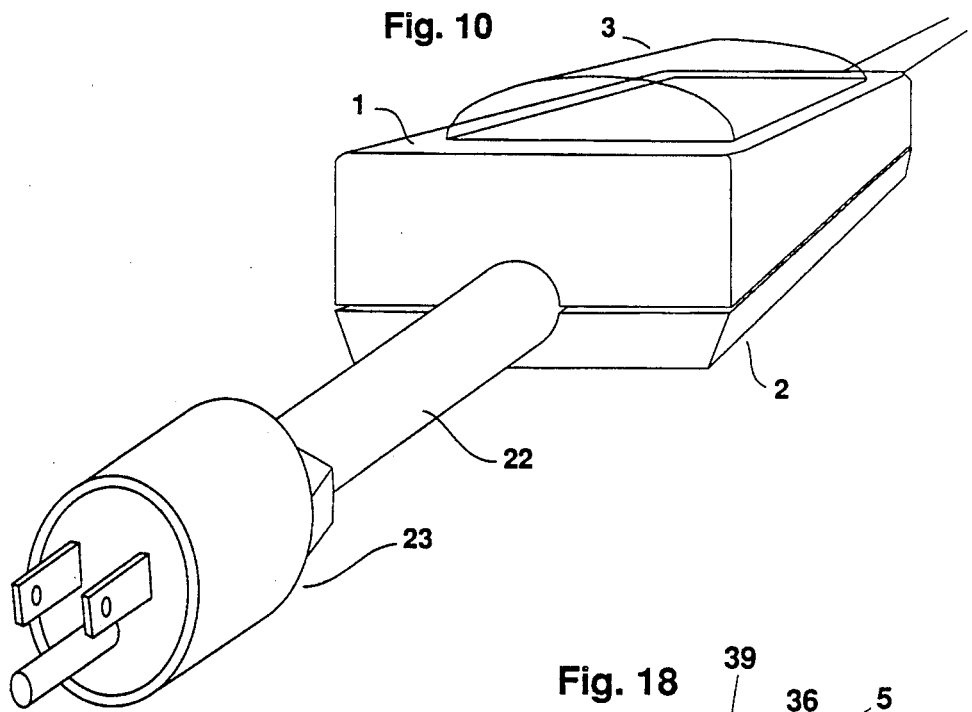
FIG. 10 is a perspective view of the embodiment shown in FIG. 6, in this case clamped on a round three conductor electrical cord which in turn is connected to a three prong male plug.
Figure 18:
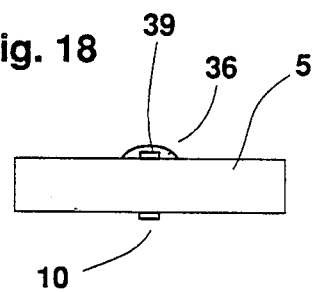
FIG. 18 is a two dimensional end view of the module shown in FIG. 14 as seen from View 1.
Figure 16:
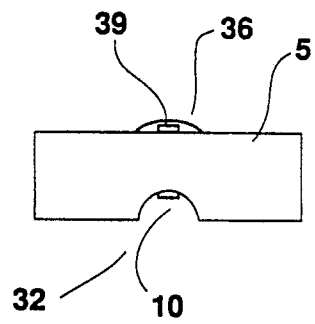
FIG. 16 is a two dimensional end view of if a module which is basically the same as the module pictured in FIG. 14 apart from the addition of a semi-circular channel to accommodate a round electrical cord.

FIG. 6 depicts another embodiment of the invention where the electrical voltage detection and indication means (3) is in modular form and can be easily slipped out of the body of the device (1). The embodiment in FIG. 6 is specifically for use with round electrical cords. FIG. 10 shows the same embodiment fitted to a cord (22) which in turn is fitted to a three prong male plug (23). The cord is clamped in place by clamping means (2) which in this example is a segment held against the main body (1) by screws (20). Because the internal conductors in the cord (22) cannot normally be identified from outside the outer insulation sheath (27), an exploratory slit (29) must be made and then a pointed electrically conductive probe (18) that is conductively bonded to a flexible electrically conductive strip (14) can be forced through the outer insulation sheath (27), the individual conductor insulation (28), and a specific conductor itself (6). Once the probe in installed, the flexible electrically conductive strip is wrapped around the electrical cord as is shown in FIG. 7 and FIG. 8. A second probe and strip is installed in the same manner a specific distance away along the electrical cord as is shown in FIG. 7. The electrical connection between strips (14) and the electrical voltage detection and indication device is illustrated in FIGS. 11 to 20.

Description of FIGS. 11 to 20

Figure 17:
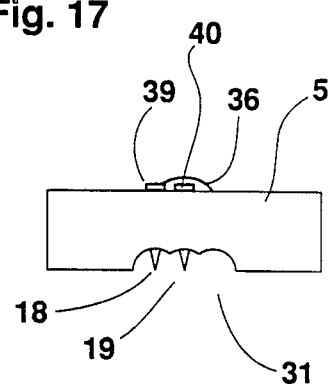
FIG. 17 is a two dimensional end view of if a module which is basically the same as the module pictured in FIG. 15 apart from the addition of a triple semi-circular channel to accommodate a flat, three conductor electrical cord.
Figure 19:
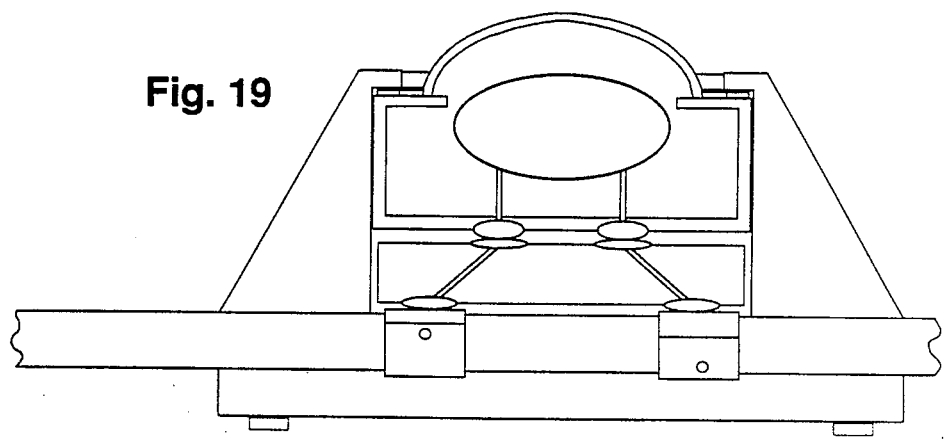
FIG. 19 is a two dimensional cross sectional view of the embodiment of the invention shown in FIG. 11 taken on the line AA with the exception that the associated electrical cord is shown as it appears externally.
Figure 20:
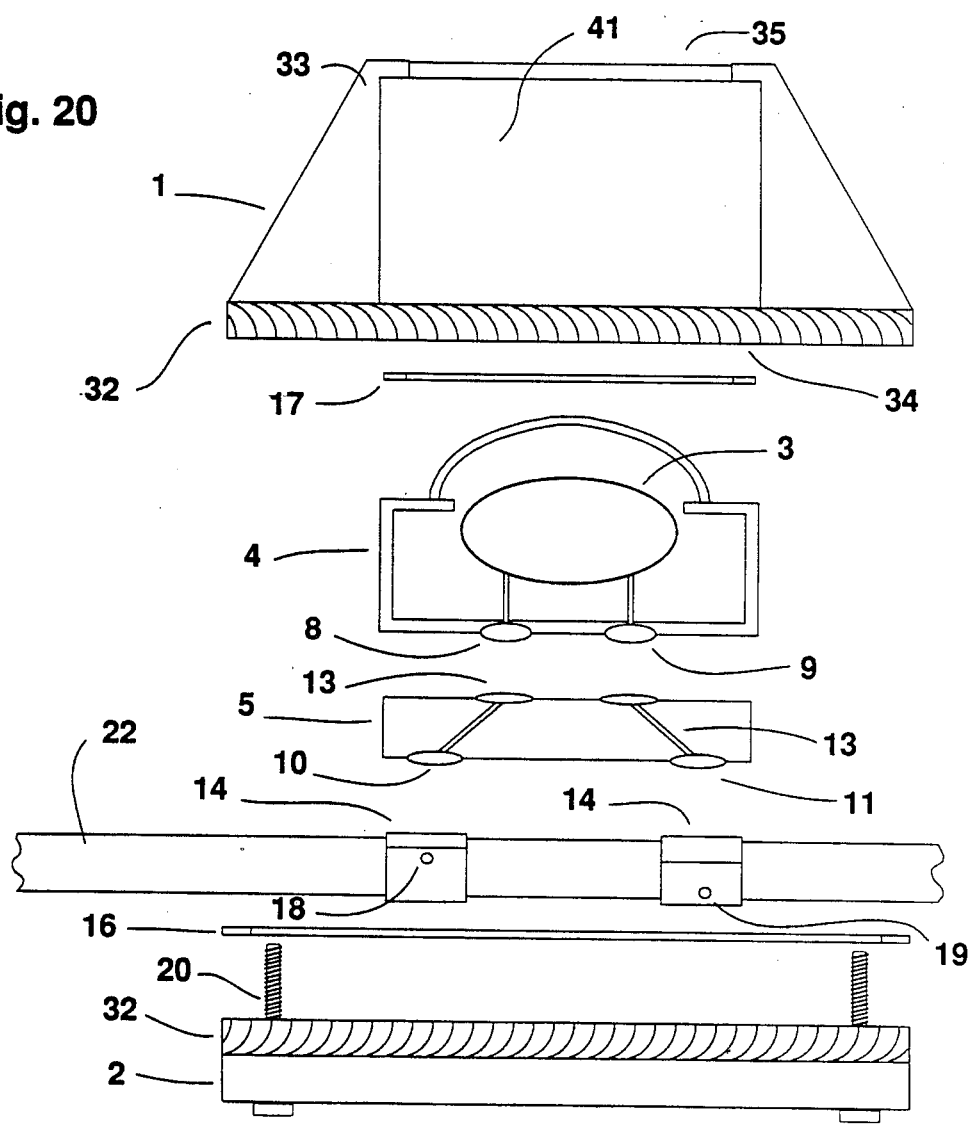
FIG. 20 is a two dimensional expanded view of the embodiment shown in FIG. 19.

FIG. 11 depicts an embodiment of the invention that is basically the same as that depicted in FIGS. 6 and 10. FIG. 12 depicts the same embodiment adapted to a three conductor flat electrical cord. FIG. 13 depicts the same embodiment except in which the contoured wire groove (31) has external dimensions sufficiently large to allow a broad variety of electrical cords to be passed through and is then fitted with a pliable waterproof tubular sleeve (26) that is matched to fit the electrical cord as well as the groove to yield a snug, waterproof fit. No further views are shown of the sleeve (26) but FIGS. 19 and 20 illustrate that, if it were being used, there would have to be cutaway sections to allow the first and second contacts (10) (11) to come into direct contact with the two conductive strips (14) (14). Further, the sleeve (26) must be slit longitudinally along one side of the tubular sleeve to allow for installation on the electrical cord. FIGS. 19 and 20 are cross section views taken along line AA in FIG. 11. The power cord (22) however is shown as it appears externally. The electrical cord (22) is the same as the cord pictured in FIG. 7 with the probes (18) and (19) and their respective flexible conductive strips (14). A first module (4), containing the electrical voltage detection and indication device (3), is slipped into a first opening (34) in the body (1), and seals against the second moisture seal means, in this example a pliable gasket (17) which in turn seals against the restrictive lip (33) which is part of the body (1). The first module (4) fits snugly into the cavity (41) in the body (1). As explained in the description of FIGS. 1 to 5, a variety of devices that detect and indicate electrical voltage in some manner, can be incorporated into the modular unit (4). The first module is equipped with two connection terminals (8) (9). A second module (5) is slipped into the same first opening (34) in the body (1), after the first module. It also fits snugly in the cavity (41) in the body (1). It is equipped with either electrically conductive contacts (10) (11) to make contact with the conductive strips (14) or it is equipped with pointed electrically conductive probes (18) (19), if a flat wire design is being clamped onto. The module is further equipped with electrically conductive transfer and contact means (13). The electrically conductive transfer and contact means consists of two contacts (36) (37) which line up with the connection terminals (8) (9) on the first module (4) when both modules are in place in the body cavity (41). An extension (39) of the first probe (18) or contact (10) and an extension (40) of the second probe (19) or contact (11) are connected to the two contacts (36) (37) by a connection means (38). The two separate electrically conductive transfer and contact means (13) (13) are insulated from each other by the material from which the module (5) is composed or by an individual sheathing of an insulative material. The entire electrically conductive transfer and contact means (13) can be formed in a variety of configurations to adapt to a variety of electrical cord types. FIG. 15 depicts a module (5). The end view of basically the same module (5) is depicted in FIG. 17, with the addition of a contoured wire groove (31). The module depicted in FIGS. 15 and 17 is designed to pierce the ground and the hot conductor on a flat, three conductor electrical cord and thus indicate the presence of power and of a functional ground. FIG. 14 is shown as seen from View 2 in FIGS. 19 and 20. FIG. 14 is also shown as seen from View 1 in FIG. 18. FIG. 14 is also basically shown as seen from View 1 in FIG. 16 with the addition of a contoured wire groove (32) to accommodate a round electrical conductor. In FIG. 19 and 20, the two modules (4) (5) are slipped into the body cavity (41). The electrical cord (22) is correctly placed with probes (18) (19) or contacts (10) (11) and conductive strips (14) (14) in the proper location and pressed against the proper second module (5). The clamping means (2) is pressed against the body (1) by the clamping screws (20) and the first moisture sealing means, in this example, a pliable gasket (16) is pressed between the body (1) and the clamping means (2). There is now an electrical circuit from one conductor of the electrical cord (22), through a first probe (18), through a conductive strip (14), through a contact (10), through a first electrically conductive transfer and contact means (13), through the first connection terminal (8), through the electrical voltage detection and indication device (3), through a second connection terminal (9), through a second electrically conductive transfer and contact means (13), through a contact (11), through a conductive strip (14), through a second probe (19), and on through a second conductor of the electrical cord (22).

OPERATION OF PREFERRED EMBODIMENT

(i) Use and Summary of Operation of Preferred Embodiments

The embodiment of the invention illustrated in FIGS. 1, 2, 3, and 5 allows the device to be specifically designed for a variety of cord shapes and sizes and to be snapped onto the cord without the use of any tools. The shape of the wire groove (31) guides the probes (18) (19) to the proper location and the fit of the device on the cord provides a seal against moisture penetration. A typical application would be as a power indicator lamp on an automotive engine block heater cord.

The embodiment illustrated in FIGS. 7, 8, 10, 16, 11, 19 and 20 allow the device to be used on electrical cord types where the arrangement of the internal conductors is not uniform.

The embodiment illustrated in FIG. 26 allows a single body (1), clamping means (2), and first module (see (4) in FIG. 20) to be used on a wide variety of cords. The pliable sleeve (26) and the second module (see (5) in FIG. 14, 15 and 20) can be adapted to a specific cord design while the remaining parts of the device remain unchanged.

The use of a removable modular device (4) for detecting and indicating electrical voltage in an electrical power cord allows an economically efficient means of achieving a very broad range of applications for the basic, quick attaching device.

CONCLUSION

From the foregoing description, one skilled in the art can easily ascertain the essential characteristics of this invention, and without departing from the spirit and scope thereof, can make various changes and modifications of the invention to adapt it to various usages and conditions Consequently, such changes and modification are properly, equitably, and "intended" to be, within the full range of equivalence of the following claims.

What I claim is:

1. An electrical power detection and indication device for external attachment onto an insulated electrical power cord having two or more insulation coated conductors, comprising
   (a) a body,
   (b) an electrical voltage detection and indication means having a first electrical connection terminal and a second electrical connection terminal, said electrical voltage detection and indication means being housed within said body,
   (c) a first and a second pointed electrically conductive probe spaced from each other and protruding from said body and rigidly attached to said body, (d) insulation means to electrically isolate said first conductive probe from said second conductive probe, (e) electrically conductive means attaching said conductive probes to said first and said second connection terminals such that a circuit is formed leading from said first conductive probe through said electrical voltage detection and indication means and on to said second conductive probe, (f) a clamping means, (g) a first moisture sealing means, whereby said body can be secured against said insulated electrical power cord by said clamping means such that said first and second pointed electrically conductive probes each penetrate the insulation of and come in contact with the internal core of separate conductors of said insulated electrical power cord, said electrical voltage detection and indication means detects and then indicates with a visual or audible signal if there is an electrical voltage differential between said separate conductors, and said first moisture sealing means prevents any moisture from penetrating the holes in said conductor insulation caused by the penetration of said electrically conductive probes.

2. An electrical power detection and indication device for external attachment onto an insulated electrical power cord having two or more insulation coated conductors, as claimed in claim 1, further comprising (a) a cavity within said body, said cavity having a first opening and a second opening opposite the first opening, (b) a restrictive lip around the periphery of said second opening, (c) a second moisture sealing means associated with said restrictive lip, (d) said electrical voltage detection and indication means being formed as a first module that will fit through said first opening and will fit snugly in said cavity in said body and seal in a stable manner against said restrictive lip and against said second moisture sealing means, (e) said pointed electrically conductive probes being rigidly attached to a second module that will fit snugly into said cavity in said body after said first module has been slipped into said cavity, said probes protruding outwards from the outer face of said second module, (f) electrically conductive transfer and contact means linking said conductive probes to said first and second connection terminals such that when said first and said second module are pressed together within said cavity, a circuit is formed leading from said first conductive probe through said electrical voltage detection and indication means and on to said second conductive probe, whereby said first module and said second module are securely held against each other and are also securely held within said cavity by the pressure of said electrical power cord being pressed between said body and said clamping means, and said first moisture sealing means prevents moisture from penetrating said first opening of said cavity.

3. An electrical power detection and indicator device for external attachment onto an insulated electrical power cord having two or more insulation coated conductors, as claimed in claim 1 or in claim 2, wherein a channel moulded in said body orients said electrical power cord so said pointed electrically conductive probes align correctly with specific conductors of said electrical power cord.

4. An electrical power detection and indicator device for external attachment onto an insulated electrical power cord having two or more insulation coated conductors, as claimed in claim 3, said clamping means consisting of a first clamping segment and a second clamping segment, said body comprising one clamping segment, at least one of said clamping segments being composed of a flexible, resilient plastic material, one said clamping segment being shaped to fit into a position immediately adjacent said second clamping segment, access to that adjacent position being attainable only through the exertion of a force directed to move the two segments into that position, attainment of said immediately adjacent position resulting in the cessation of the need for force to maintain the achieved relative position of said two clamping segments, whereby, the placement of said electrical power cord between said two clamping segments and the forcing of said two clamping segments into their said immediately adjacent position results in the secure clamping of said electrical power cord relative to said two clamping segments.

5. An electrical power detection and indicator device for external attachment onto an insulated electrical power cord having two or more insulation coated conductors, as claimed in claim 4, said first moisture sealing means consisting of the accurate fit of said moulded channel relative to said insulated electrical power cord in combination with the pressure exerted on said electrical power cord by said clamping means.

6. An electrical power detection and indication device for external attachment onto an insulated electrical power cord having two or more insulation coated conductors, comprising (a) a body, (b) an electrical voltage detection and indication means having a first electrical connection terminal and a second electrical connection terminal, said electrical voltage detection and indication means being housed within said body, (c) a first and a second electrically conductive contact spaced from each other and protruding from said body and rigidly attached to said body, (d) insulation means to electrically isolate said first electrically conductive contact from said second conductive contact, (e) electrically conductive means attaching said conductive contacts to said first and said second connection terminals such that a circuit is formed leading from said first conductive contact through said electrical voltage detection and indication means and on to said second conductive contact, (f) two flexible electrically conductive strips each strip having a single pointed electrically conductive contact protruding at right angles from the surface of said flat strip, said probe being bonded to said strip so as to form one electrically conductive unit, (g) a clamping means, (h) a first moisture sealing means, whereby said conductive contacts can each be selectively penetrated through the insulation coating on two separate insulation coated conductors of said electrical power cord so as to make electrical contact with said conductor, said penetration points are spaced from each other lengthwise relative to said electrical power cord, said flexible conductive strips can be wrapped tightly around the circumference of the cross section of said electrical power cord, said body can be secured against said insulated electric power cord by said clamping means such that said first and second electrically conductive contacts each come in contact with one of said flexible conductive strips, said electrical voltage detection and indication means detects and then indicates with a visual or audible signal if there is an electrical voltage differential between said separate conductors, and said first moisture sealing means prevents any moisture from contacting said flexible conductive strips or penetrating the holes in said conductor insulation caused by the penetration of said electrically conductive probes.

7. An electrical power detection and indicator device for external attachment onto an insulated electric power cord having two or more insulation coated conductors, as claimed in claim 6, further comprising
 (a) a cavity within said body, said cavity having a first opening and a second opening opposite the first opening,
 (b) a restrictive lip around the periphery of said second opening,
 (c) a second moisture sealing means associated with said restrictive lip,
 (d) said electrical voltage detection and indication means being formed as a first module that will fit through said first opening and will fit snugly in said cavity in said body and seal in a stable manner against said restrictive lip and against said second moisture sealing means,
 (e) said electrically conductive contacts being rigidly attached to a second module that will fit snugly into said cavity in said body after said first module has been slipped into said cavity, said contacts protruding outwards from the outer face of said second module,
 (f) electrically conductive transfer and contact means linking said conductive contacts to said first and second connection terminals such that when said first and said second module are pressed together within said cavity, a circuit is formed leading from said first conductive contact through said electrical voltage detection and indication means and on to said second conductive contact,
 whereby said first module and said second module are securely held against each other and are also securely held within said cavity by the pressure of said electrical power cord being pressed between said body and said clamping means, and said first moisture sealing means prevents moisture from penetrating said first opening of said cavity.

8. An electrical power detection and indication device for external attachment onto an insulated electrical power cord having two or more insulation coated conductors, as claimed in claim 6 or claim 7, wherein said moisture sealing means consists of a pliable, waterproof, tubular sleeve that conforms to said body and to said clamping means and said sleeve has an internal passage that conforms to the outer dimensions of said electrical power cord, has sections removed to accommodate said electrically conductive strips and also said conductive contacts, and further said sleeve is slit along one side to allow insertion of said electrical power cord,
 whereby several sizes of electrical power cords can be fitted to a single size of said body and said clamping means by altering the size and shape of said moisture sealing means.

* * * * *